US010936286B2

(12) United States Patent
Greene et al.

(10) Patent No.: US 10,936,286 B2
(45) Date of Patent: Mar. 2, 2021

(54) FPGA LOGIC CELL WITH IMPROVED SUPPORT FOR COUNTERS

(71) Applicant: Microsemi SoC Corp., San Jose, CA (US)

(72) Inventors: Jonathan W. Greene, Palo Alto, CA (US); Joel Landry, Colorado Springs, CO (US)

(73) Assignee: Microsemi SoC Corp., San Jose, CA (US)

(*) Notice: Subject to any disclaimer, the term of this patent is extended or adjusted under 35 U.S.C. 154(b) by 136 days.

(21) Appl. No.: 16/242,998

(22) Filed: Jan. 8, 2019

(65) Prior Publication Data

US 2020/0150925 A1 May 14, 2020

Related U.S. Application Data

(60) Provisional application No. 62/760,493, filed on Nov. 13, 2018.

(51) Int. Cl.
*G06F 7/506* (2006.01)
*H03K 19/17736* (2020.01)
*H03K 19/17728* (2020.01)

(52) U.S. Cl.
CPC ....... *G06F 7/506* (2013.01); *H03K 19/17728* (2013.01); *H03K 19/17744* (2013.01); *G06F 2207/5063* (2013.01)

(58) Field of Classification Search
CPC .. G06F 7/5057; G06F 1/03; G06F 30/34–347; H03K 19/17728
See application file for complete search history.

(56) References Cited

U.S. PATENT DOCUMENTS

| 5,724,276 | A  | * | 3/1998  | Rose ........................ G06F 7/503 |
|           |    |   |         | 708/235                                  |
| 7,268,584 | B1 | * | 9/2007  | Cashman ............... G06F 7/5055       |
|           |    |   |         | 326/38                                   |
| 2016/0246571 | A1 | * | 8/2016  | Walters, III ............ G06F 7/575 |
| 2016/0315619 | A1 | * | 10/2016 | Fan ..................... H03K 19/1737 |
| 2020/0019375 | A1 | * | 1/2020  | Pugh ....................... H04N 19/44 |

OTHER PUBLICATIONS

J. Hormigo, M. Ortiz, F. Quiles, F. J. Jaime, J. Villalba and E. L. Zapata, "Efficient Implementation of Carry-Save Adders in FPGAs," 2009 20th IEEE International Conference on Application-specific Systems, Architectures and Processors, pp. 207-210, 2009 (Year: 2009).*

B. Khurshid and R. N. Mir, "High efficiency generalized parallel counters for look-up table based FPGAs," International Journal of Reconfigurable Computing, vol. 2015, Article ID 518272, 16 pages, 2015 (Year: 2015).*

(Continued)

*Primary Examiner* — Matthew D Sandifer
(74) *Attorney, Agent, or Firm* — Glass and Associates; Kenneth Glass; Kenneth D'Alessandro

(57) ABSTRACT

A logic cell for a programmable logic integrated circuit having K function inputs, where K is the largest number such that the logic cell can compute any function of K inputs, and where the logic cell is configurable to implement one bit of a counter in parallel with any independent function of K-1 of the K inputs.

5 Claims, 10 Drawing Sheets

(56) References Cited

OTHER PUBLICATIONS

M. Kumm and P. Zipf, "Efficient High Speed Compression Trees on Xilinx FPGAs," in Methoden und Beschreibungssprachen zur Modellierung und Verifikation von Schaltungen und Systemen (MBMV), pp. 171-182, 2014 (Year: 2014).*
"Virtex-4 FPGA User Guide", UG070 (v2.6), Xilinx, Inc., San Jose, CA, Dec. 1, 2008.
PCT/US2019/042980, International Search Report, dated Oct. 29, 2019.
PCT/US2019/042980, Written Opinion of the International Searching Authority, dated Oct. 29, 2019.
Thomas B. Preusser et al., "Enhancing FPGA Device Capabilities by the Automatic Logic Mapping to Additive Carry Chains", Field Programmable Logic and Applications (FPL), 2010 International Conference on, IEEE, Piscataway, NJ, USA, Aug. 31, 2010 (Aug. 31, 2010), pp. 318-325.
Thomas B Preusser et al., "Mapping basic prefix computations to fast carry-chain structures", Field Programmable Logic and Applications (FPL) 2009 International Conference on, IEEE, Piscataway, NJ, USA, Aug. 31, 2009 (Aug. 31, 2009), pp. 604-608, p. 605, left-hand column, paragraph 3—p. 607, left-hand column, paragraph 5; figures 1,2.

* cited by examiner

F0=0
F1=1
G=F0
P=Y

N-bit Output

FPGA LOGIC CELL WITH IMPROVED SUPPORT FOR COUNTERS

BACKGROUND

The present invention relates to logic circuits used in user-programmable circuits such as field programmable gate arrays (FPGAs). More particularly, the present invention relates to logic cells for such programmable integrated circuits that have improved support for counter applications.

As is known in the art, FPGAs are composed of logic cells connected by a programmable routing network. The value of any logic cell output connected to the programmable routing network can be transmitted through the network to any logic cell input connected to the network. A common type of logic cell includes a K-input look-up table (LUT) and additional logic functions such as multiplexers and a carry chain. The value K may range from 2 to 10 or more; the most common values in practice are 3, 4 and 6. FIG. 1 shows a prior-art logic cell 10 (like the one used in the Microsemi PolarFire® FPGA family) having a 4-input LUT shown within dashed lines 12 formed from two 3-input LUTs 14a and 14b and a 2-input multiplexer 16. Input $In_1$ to the 4-input LUT 12 at reference numeral 18 is connected to the select input of the multiplexer 16, and the $In_2$, $In_3$, and $In_4$ inputs to the 4-input LUT 12 at reference numerals 20, 22, and 24, respectively, are presented to both of the 3-input LUTs 14a and 14b. Configuration bits represented by square 26 are used to define the function of 3-input LUT 14a and configuration bits represented by square 28 are used to define the function of 3-input LUT 14b.

A carry chain implementation shown within dashed lines 30 includes an additional three multiplexers. A 4-input multiplexer 32 has data inputs connected to the respective outputs of 3-input LUTs 14a and 14b, as well as to constants logic 0 and logic 1, and produces the output G. Configuration bits represented by square 34 are used to choose which one of the inputs of the 4-input multiplexer 32 will be passed to the output at G.

A 3-input multiplexer 36 has data inputs connected to the output of the multiplexer 16, as well as to constants logic 0 and logic 1, and produces the output P. Configuration bits represented by square 38 are used to choose which one of the inputs of the third multiplexer 36 will be passed to the output at P.

A carry-out multiplexer 40 has a data input connected to the carry-in input CI 42 of the logic cell 10, and a data input connected to the output G of the 4-input multiplexer 32. The output of the carry out multiplexer 40 is connected to the carry-out CO 44 of the logic cell 10. The select input of the carry out multiplexer 40 is connected to the output P of the 3-input multiplexer 36.

The exclusive-OR gate 46 has a first input connected to the output of the 4-input LUT 12 at the output of multiplexer 16, which also forms the main output Y 48 of the logic cell 10. A second input of the exclusive-OR gate 46 is connected to the carry-in input CI 42 of the logic cell 10. The output of the exclusive-OR gate 46 is the sum output S 50 of the logic cell 10.

The $In_1$, $In_2$, $In_3$, and $In_4$ inputs (18, 20, 22, and 24) and Y and S outputs (48 and 50, respectively) are connected to a programmable routing network in the integrated circuit, shown at reference numeral 52. The carry-in input CI 42 is driven directly by the carry-out output of a previous logic cell 10 in the carry chain; these are not connected to the programmable routing network.

Prior-art LUT-based FPGA logic cells like the logic cell 10 of FIG. 1 can implement one bit of an up or down counter or one bit of an accumulator. This is shown in FIG. 2, which is a block diagram of an N-bit counter implemented using N logic cells identified as logic cell 10-0, 10-1 and 10-(N-1) and D-flip-flops 54-0, 54-1 and 54(N-1). However, because in each of the logic cells 10-0, 10-1 and 10-(N-1) the first multiplexer 16 is required to drive the 3-input multiplexer 36 and exclusive-OR gate 46 used to implement the counter function, none of the logic cells 10-0, 10-1 and 10-(N-1) can use the 4-input LUT 12 for other purposes while implementing the counter, despite the fact that they are not being utilized to implement the counter.

An important property of an FPGA logic cell is how many of its inputs and outputs must be connected to the programmable routing network. For instance, the prior-art logic cell 60 shown in FIG. 3A was used in the Virtex® 4 FPGA family manufactured by Xilinx, Inc., of San Jose, Calif. Some of the elements of logic cell 60 of FIG. 3A are common to the logic cell 10 of FIG. 1 and will be referred to in FIG. 3A using the same reference numerals used to designate those same elements in FIG. 1.

The logic cell 60 includes a 4-input LUT portion 62 having inputs $In_1$, $In_2$, $In_3$, $In_4$ identified at reference numerals 18, 20, 22, and 24, respectively. The small square 64 indicates the configuration bits that are used to define the function of the $In_1$, $In_2$, $In_3$, $In_4$ LUT inputs that the LUT 62 will perform. The output of the LUT 62 forms the Y output 66 of the logic cell 60.

A carry chain section of the logic cell 60 is identified within dashed lines 68. The carry chain 68 includes a 6-input multiplexer 70. A first input of the 6-input multiplexer 70 is driven by a 2-input AND gate 72 driven by the $In_1$ and $In_2$ inputs (22 and 24) to the LUT 62. The second two inputs to the 6-input multiplexer 70 are driven directly by the $In_1$ and $In_2$ inputs (22 and 24) to the LUT 62. A fourth input to the 6-input multiplexer 70 is driven by an input X at reference numeral 74. Two remaining inputs to the 6-input multiplexer 70 are driven by logic zero and logic one constant values. The small square 76 indicates the configuration bits that are used to select which one of the inputs of the 6-input multiplexer 68 will be passed to its output.

The output of the 6-input multiplexer 70 is coupled to one input of a 2-input carry-out multiplexer 40. The other input of the carry-out multiplexer 40 is driven by the output of a 2-input multiplexer 78 having one of its inputs coupled to the CO output of a lower-order logic cell on line 80. The other input to the multiplexer 78 is driven by the X input on line 82 shown in dashed lines because this connection is made only in alternate (e.g., odd or even) instances of logic cell 60.

The connections to LUT inputs $In_1$, $In_2$, $In_3$, $In_4$ (18, 20, 22, and 24) and input X (74) come from the programmable routing network 52. As can be seen from FIG. 3A, the logic cell 60 adds an additional connection from the programmable routing network 52 to the carry-in input via input X at 74, and from the carry-out output 44 to the programmable routing network 52. Like the logic cell 10 of FIG. 1, the logic cell 60 is based on a 4-input LUT 62, but implements the carry chain 66 in a different way. While the logic cell 10 of FIG. 1 has 4 inputs and 2 outputs connected to the programmable routing network 52, the logic cell 60 of FIG. 3A has 5 such inputs and 3 such outputs. These additional connections between the logic cell 60 and the programmable routing network 52 may provide additional versatility, but they also significantly increase the complexity and hence the cost of the programmable routing network 52.

Another important property of an FPGA logic cell is the number K of inputs to the LUT. Some existing FPGAs use 4-input LUT cells (K=4), as shown in logic cells 10 and 60 of FIGS. 1 and 3A, which are best overall for low-cost, low-power FPGAs. Other existing FPGAs use a fracturable 6-input LUT (K=6). These can implement a wider variety of functions, but consume more area and power. A recent study of tradeoffs related to the number of LUT inputs is found in "Improving FPGA Performance with a S44 LUT Structure", Proceedings of the 2018 ACM/SIGDA International Symposium on Field-Programmable Gate Arrays, 2018.

One prior-art example of a 6-input LUT logic cell is shown in FIG. 3B. This is a block diagram of a logic cell 90 that includes a fracturable 6-input LUT shown in dashed lines 92. This logic cell is equivalent to a Series 7 logic cell manufactured by Xilinx, Inc. of San Jose, Calif.

The 6-input LUT 92 is formed from two 5-input LUTs 94a and 94b. As in the logic cell 10 of FIG. 1, the small squares 96 and 98, respectively, represent configuration bits that are used to define the functions of the LUTs 94a and 94b. The five function inputs to LUTs 94a and 94b are indicated at reference numerals 100 ($In_2$), 102 ($In_3$), 104 ($IN_4$), 106 ($In_5$), and 108 ($In_6$).

A multiplexer 110 has as its data inputs the respective outputs of LUTs 94a and 94b, labeled F0 and F1, respectively. The select input of the multiplexer 110 at reference numeral 112 is connected to the $In_1$ input of the logic cell 90 and serves as the sixth input of the 6-input LUT 92. The output of the multiplexer 110 is connected to the output Y of the logic cell 60 as indicated at reference numeral 48.

The carry logic of the logic cell 90 is shown within dashed lines 114 and is formed from two multiplexers 36 and 40 and an exclusive-OR gate 46. Multiplexer 36 (the G multiplexer) has a first data input connected to the F0 output of LUT 94a, a second data input connected to the F1 output of LUT 94b, and a third input connected to a constant low logic level. The small square 38 represents configuration bits that are used to route one of the inputs of multiplexer 36 to its output.

The second multiplexer 40 is a carry-out multiplexer has one of its data inputs connected to the output G of multiplexer 36 and the other of its data inputs connected to the carry-in (CI) input of the logic cell identified at reference numeral 42. Its select input is connected to the output of multiplexer 110. The output of the carry-out multiplexer 40 is connected to the CO output of the logic cell 90 as indicated at reference numeral 44.

The exclusive-OR gate 46 has a first input connected to the carry-in input 42 of the logic cell 90 and a second input connected to the output of multiplexer 110. The output of the exclusive-OR gate 46 is connected to the sum (S) output of the logic cell 90 as indicated at reference numeral 50.

The logic cell 90 has a first output Y shown at reference numeral 48, that represents the output of the six input LUT 92 and a second output Y1 shown at reference numeral 116 that is connected to the F0 output of the 5-input LUT 94a. The six input LUT 92 in the logic cell 90 of FIG. 3B is referred to as being "fracturable" in that the input LUTs 94a and 94b can be used independently because direct outputs Y 48 and Y1 116 are available from both 5-input LUTs (output Y1 116 from 5-input LUT 94a and output Y 48 from 5-input LUT 94b through multiplexer 110).

The logic cell 90 is shown in FIG. 3B configured to implement one bit of a counter and any independent function of 4 inputs. The $In_2$ input 100 serves as the counter input. The lower 5-input LUT 94b is configured so that F1=$In_2$ at its output. The $In_1$ input 112 is tied to a logic 1 level, so at reference numeral 48 the Y output of the logic cell 90 is Y=$In_2$. The sum output at reference numeral 50 is S=EXOR($In_2$,CI). The output G of multiplexer 36 is configured to pass the low logic level 0 so the carry-out output of the logic cell 90 at reference numeral 44 CO=AND($In_2$,CI). The Y1 output 116 of the logic cell 90 is still available to generate any function of the four remaining inputs $In_3$, $In_4$, $In_5$, and $In_6$ from the 5-input LUT 94a. Because the configuration shown in FIG. 3B requires use of the $In_1$ and $In_2$ LUT inputs for the counter function these inputs cannot be used for any independent LUT function, effectively reducing the LUT to a 4-input LUT (94a) whose output is available at Y1.

Some designs programmed into FPGAs require large numbers of up- or down-counters. Especially for such designs, it would be beneficial if the 4-input LUT cell of FIG. 1 could implement a counter while preserving use of the LUT for other purposes. It would also be beneficial if a 6-input LUT cell could implement a counter while preserving use of more than 4 inputs of the LUT.

In addition, binary neural networks are an application of increasing importance. Binary neural networks often require implementation of a function called "population count" or "pop count". This function represents the number of ones among a set of M boolean inputs as a log 2(M)-bit binary output value. Pop counters are typically implemented using compressors and an accumulator (which allows the value to be computed over multiple clock cycles).

Compressors are a family of logic circuits that take as input multiple binary numerical values and produce their sum as a single binary numerical output value. For instance, the well-known full adder can also be referred to as a 3:2 compressor; it takes three one-bit inputs and produces a single two-bit output. In some cases, compressors may be organized in a chain similar to a carry chain, with each compressor receiving one or more additional inputs from the previous compressor in the chain and generating the same number of additional outputs to the next compressor in the chain. For more details on compressors, see Gajski, "Parallel Compressors", IEEE Transactions on Computers, Vol. c-29, No. 5, May 1980. With previous logic cells such as that of FIG. 1 (which use power-efficient 4-input LUTs and limited connections to the programmable routing network), two logic cells are required to implement each 3:2 compressor: one to produce each of the two outputs. A 3:2 compressor can be implemented in a single one of the logic cells of FIGS. 3A and 3B, but the logic cell 60 of FIG. 3A requires more connections to the programmable routing network 52 and the logic cell 90 of FIG. 3B consumes both more area and more power as well as having an additional connection to the programmable routing network for the CO output.

It would be advantageous to increase the efficiency of implementing counters and compressors in 4-input LUT logic cells such as that of FIG. 1 without increasing the number of inputs and outputs connected to the programmable routing network (making the programmable routing network more complex and more costly) or increasing the number K of LUT inputs (which would significantly increase the area and power consumption of the logic cell). Such increased efficiency would enable users to pack more logic in an FPGA chip having the same number of cells, and possibly clock it faster.

BRIEF DESCRIPTION

According to an aspect of the present invention, a logic cell for a programmable logic integrated circuit is presented wherein K is the largest number such that the logic cell can compute any function of K inputs, and the logic cell is configurable to implement one bit of a counter in parallel with any independent function of K-1 inputs.

According to an aspect of the invention the counter can be an up counter or a down counter.

According to an aspect of the present invention, the logic cell is further configurable to implement one bit of a counter in parallel with any independent function of K inputs.

According to an aspect of the present invention, the logic cell is further configurable to implement one bit of a two-input adder.

According to an aspect of the present invention, the logic cell is further configurable to implement one bit of a two-input adder and the logic cell has K function inputs on which the function is to be computed, a counter input receiving a current state of a counter bit, a carry-in input, a carry-out output, a primary output at which an output of the K-input function is available, a sum output at which an output of one of the one-bit of the counter and an output of the one-bit adder is available, a K-input LUT whose inputs are driven by the K function inputs and whose output drives the primary output; and a carry circuit coupled to the carry-in input and counter input, and which drives the carry-out output and sum output. The carry circuit can invert or not invert the count input.

According to two particular aspects of the invention, K=4 and K=6.

According to an aspect of the invention, a logic cell for a programmable logic integrated circuit has only 4 inputs connected to a programmable routing network, the logic cell has only two outputs connected to the programmable routing network, the logic cell has a carry-in input, the logic cell may be configured in a first way such that the value of the carry-in input appears at one of the outputs, and in parallel any function of the 4 inputs appears at the other output, and the logic cell may be configured in a second way to implement one bit of a two-input adder, with the sum bit appearing at one of the two outputs.

According to an aspect of the invention, the logic cell can be used to implement a chain of 4:2 compressors in which each 4:2 compressor in a chain of 4:2 compressors can be implemented in 2 instances of the logic cell.

According to an aspect of the invention, a logic cell for a programmable logic integrated circuit includes a carry input, a 2-input carry-out multiplexer producing a carry-out signal, a 2-input exclusive-OR gate having a first input driven by the carry input and a second input driven by a signal that does not also drive the programmable routing network, a multiplexer producing a signal P that drives a select input of the carry out multiplexer and one input of the exclusive-OR gate.

According to an aspect of the invention, a logic cell for a programmable logic integrated circuit includes K data inputs, a primary output, a carry-in input, a carry-out output, a counter input, a sum output, a K-input lookup table (LUT) having K LUT inputs each connected to a different one of the K data inputs, and a LUT output directly connected to the primary output, the K-input LUT including, a first (K-1)-input lookup table LUT and a second (K-1)-input LUT both sharing in common second through Kth inputs to the K-input LUT, each of the first and second (K-1)-input LUTs having an output, a first multiplexer having a first input coupled to the output of the first (K-1)-input LUT, a second data input coupled to the output of the second (K-1)-input LUT, and a select input coupled to a first input of the K-input LUT, the first multiplexer having an output forming the LUT output that is directly connected to the primary output.

According to an aspect of the invention, the logic cell has a carry circuit including a second multiplexer having a first data input coupled to the output of one of the first and second (K-1)-input LUTs, a second data input coupled to a logic-low constant voltage, select inputs coupled to configuration circuitry for the logic cell, and a data output, a third multiplexer having a first data input coupled to the counter input of the logic cell, a second data input coupled to the LUT output, a third data input coupled to a logic-low constant voltage, select inputs coupled to configuration circuitry for the logic cell, and a data output, a carry-out multiplexer having a first data input coupled to the data output of the second multiplexer, a second data input coupled to the carry-in input of the logic cell, a select input coupled to the data output of the third multiplexer, and a data output coupled to the carry-out output of the logic cell, and an exclusive-OR gate having a first input coupled to the carry-in input of the logic cell, a second input coupled to the data output of the third multiplexer, and an output coupled to the sum output of the logic cell. The carry circuit can further include a fourth multiplexer coupled between the counter input of the logic cell and the first data input of the third multiplexer, the fourth multiplexer having a first data input and a second data input, the second data input being an inverting data input, the first and second data inputs coupled together to the counter-input of the logic cell, a select input coupled to configuration circuitry for the logic cell, and an output coupled to the first data input of the third multiplexer.

According to an aspect of the invention at least one of the second and third multiplexers has a data input coupled to a logic-high constant voltage.

According to an aspect of the invention the second multiplexer has a data input coupled to the output of the first (K-1)-input LUT and a data input coupled to the output of the second (K-1)-input LUT.

BRIEF DESCRIPTION OF THE DRAWING FIGURES

The invention will be explained in more detail in the following with reference to aspects and to the drawing in which are shown:

DETAILED DESCRIPTION

Persons of ordinary skill in the art will realize that the following description is illustrative only and not in any way limiting. Other aspects will readily suggest themselves to such skilled persons.

The present invention improves the efficiency of existing LUT-based FPGA logic cells at implementing up, down and pop counters. When implementing each of these functions, some of the K-input LUTs in some of the logic cells remain available to generate any function of the K inputs to those LUTs.

Figure 4:
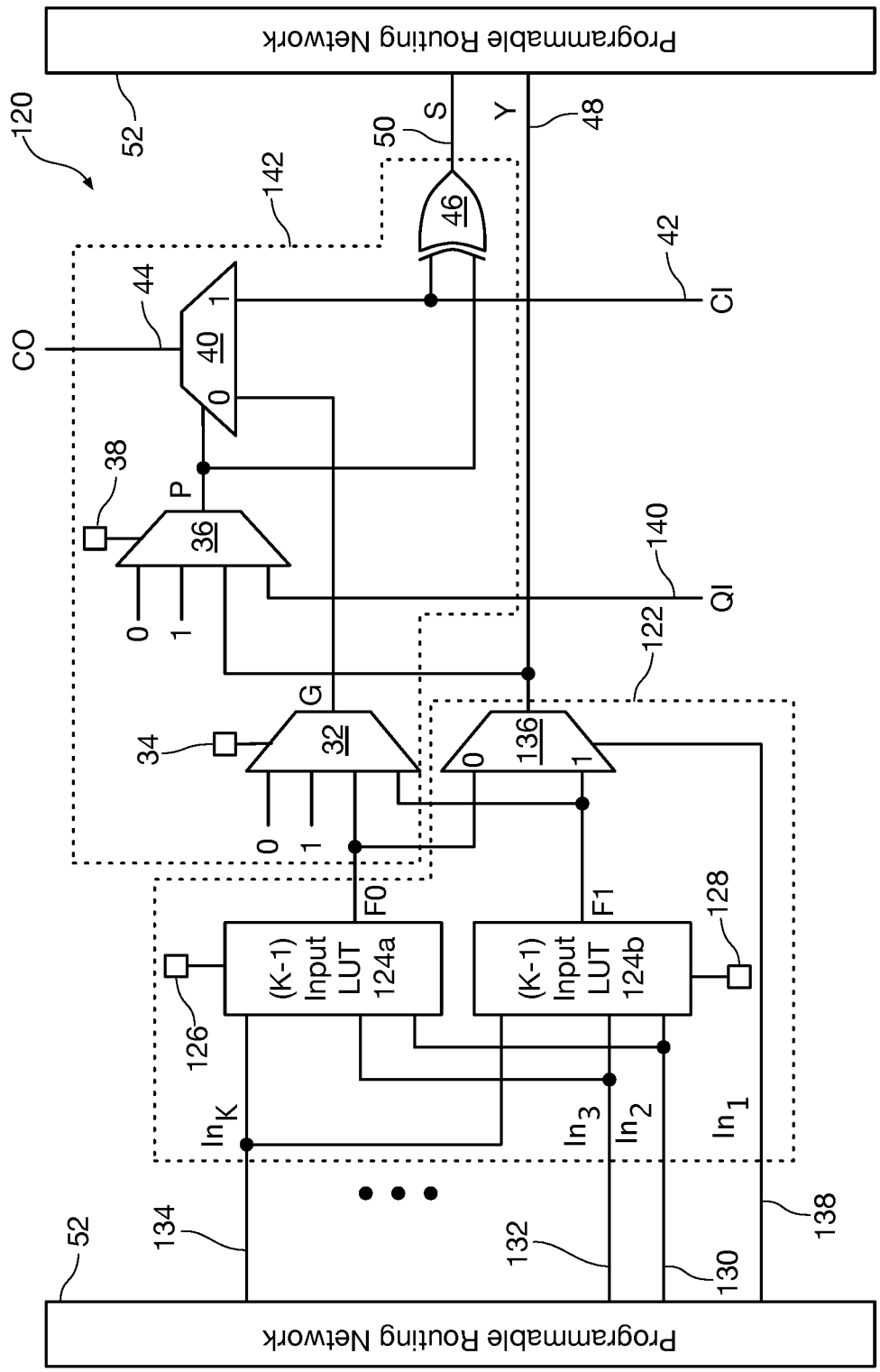
FIG. 4 is a block diagram of a logic cell in accordance with an aspect of the present invention.

In accordance with one aspect of the present invention, an illustrative LUT-based logic cell 120 that allows improved efficiency for up counters and pop counters is shown in FIG. 4, to which attention is now drawn. Some of the elements of logic cell 120 of FIG. 4 are common to the logic cells shown in previous drawing figures and will be referred to in FIG. 4 using the same reference numerals used to designate those same elements in the previous drawing figures.

The logic cell 120 of FIG. 4 includes a K-input LUT shown within dashed lines 122 formed from a first (K-1)-input LUT 124a and a second (K-1)-input LUT 124b. The small squares 126 and 128 represent the configuration inputs used to define the functions of LUTs 124a and 124b respectively. Both LUTs 124a and 124b share in common the K-1 function inputs ($In_2$, $In_3$, . . . $In_K$ shown at reference numerals 130, 132, and 134, respectively). A first (2-input) multiplexer 136 has a first data input coupled to the output F0 of the first (K-1)-input LUT 124a, a second data input coupled to the output F1 of the second (K-1)-input LUT 124b, and a select input coupled to a function input $In_1$ at reference numeral 138 of the K-input LUT 122. The data output of the first multiplexer 136 serves as the output of the K-input LUT 122 and is directly connected to the primary output (Y) of the logic cell the main output of the logic cell 120 shown at reference numeral 48. In one particular instance of the present invention, K=4.

The logic cell 120 of FIG. 4 also includes a carry-in input CI 42, a counter input QI 140, a carry-out output CO 44, and a sum output S 50. A carry circuit 142 in the logic cell of FIG. 4 includes a second multiplexer shown in FIG. 4 as a 4-input multiplexer 32 having a first data input coupled to the F0 output of the first 3-input LUT 124a, a second data input coupled to the F1 output of the second 3-input LUT 124b, a third data input coupled to a logic-high constant voltage, a fourth data input coupled to a logic-low constant voltage, select inputs shown as small square 34 coupled to configuration circuitry for the multiplexer 32 used to choose which one of the inputs of the second carry multiplexer 32 will be passed to its data output, and a data output denoted G. A third multiplexer is shown in FIG. 4 as a 4-input multiplexer 36 in the carry circuit 142 of the logic cell of FIG. 4 has a first data input coupled to the counter input QI 140 of the logic cell 120, a second data input coupled to the output of the K-input LUT 122 at the first multiplexer 136, a third data input coupled to a logic-high constant voltage, a fourth data input coupled to a logic-low constant voltage, select inputs shown as a small square 38 coupled to configuration circuitry for the third multiplexer 36 used to choose which one of the inputs of the third multiplexer 36 will be passed to its data output, and a data output denoted P. A carry-out multiplexer shown in FIG. 4 as a 2-input multiplexer 40 in the carry circuit 142 of the logic cell 110 of FIG. 4 has a first data input coupled to the data output G of the second multiplexer 32, a second data input coupled to the carry-in input CI 42 of the logic cell 120, a select input coupled to the P data output of the third multiplexer 36, and a data output coupled to the carry-out output CO 44 of the logic cell 120. An exclusive-OR gate 46 in the carry circuit 142 of the logic cell 120 of FIG. 4 has a first input coupled to the carry-in input CI 42 of the logic cell 120, a second input coupled to the data output P of the third multiplexer 36, and an output coupled to the sum output S 50 of the logic cell 120.

In some implementations of the invention, either of the F0 or F1 inputs from LUTs 124a and 124b, or the logic-high constant voltage input can be omitted from the second multiplexer 32, and/or the logic-high constant voltage input can be omitted from the third multiplexer 36.

Figure 1:
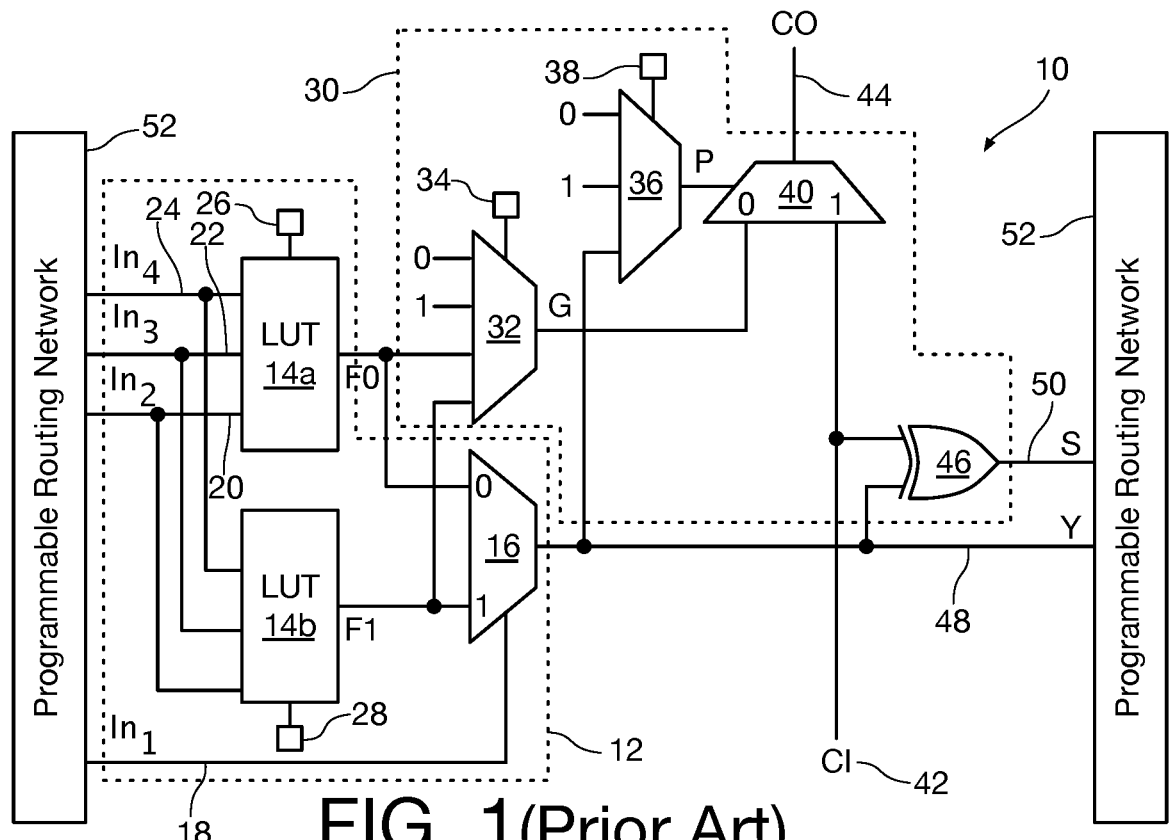
FIG. 1 is a block diagram of a prior-art logic cell.

The structural differences between the logic cell 120 according to the aspect of the invention illustrated in FIG. 4 and the prior-art logic cell in FIG. 1 are the use of the second 4-input multiplexer 36 to drive the exclusive-OR gate 46 that generates the sum output S 50, and the addition of a QI counter input 140 to the logic cell 120 as shown in FIG. 4.

Figure 2:
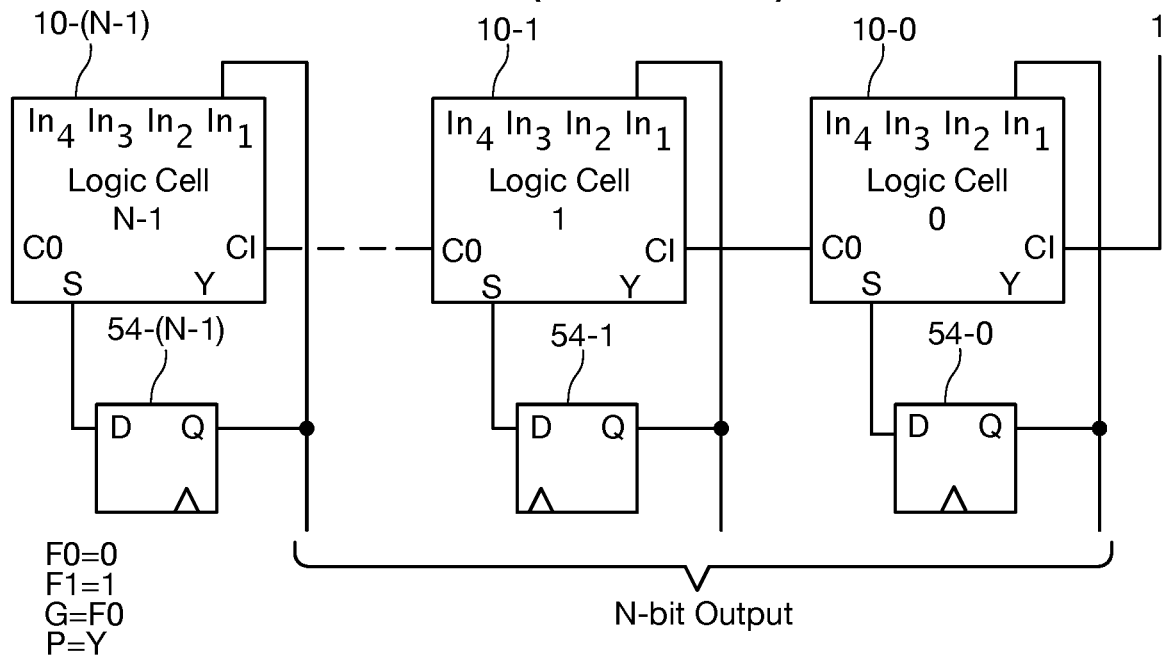
FIG. 2 is a block diagram of an up counter using one prior-art logic cell of FIG. 1 per bit.

Broadly, the logic cell 120 of FIG. 4 has K function inputs, a QI input and a carry input. The particular example shown in FIG. 4 includes K function inputs $In_1$ 138, $In_2$ 130, $IN_3$ 132, through $In_K$ 134. To implement logic cells having larger values of K, additional function inputs can be added, each driving both of LUTs 124a and 124b. The primary output Y 48 of the logic cell 120 presents a value that is any function of the K function inputs. A second output (the carry output CO 44) presents a value present on the carry input CI 42 or an output sourced by the second multiplexer 32 as selected by the output of the third multiplexer 36. The inputs $In_1$, $In_2$, $In_3$, . . . $In_K$, and outputs S and Y are connected to the programmable routing network. The QI input can be driven by the flip-flop associated with the logic cell, as described above in relation to FIG. 2, but need not be driven by the programmable routing network. The carry output CO of one cell directly drives the carry input CI of the next cell in the carry chain, and neither CI nor CO need to be connected to the programmable routing network.

Figure 5:
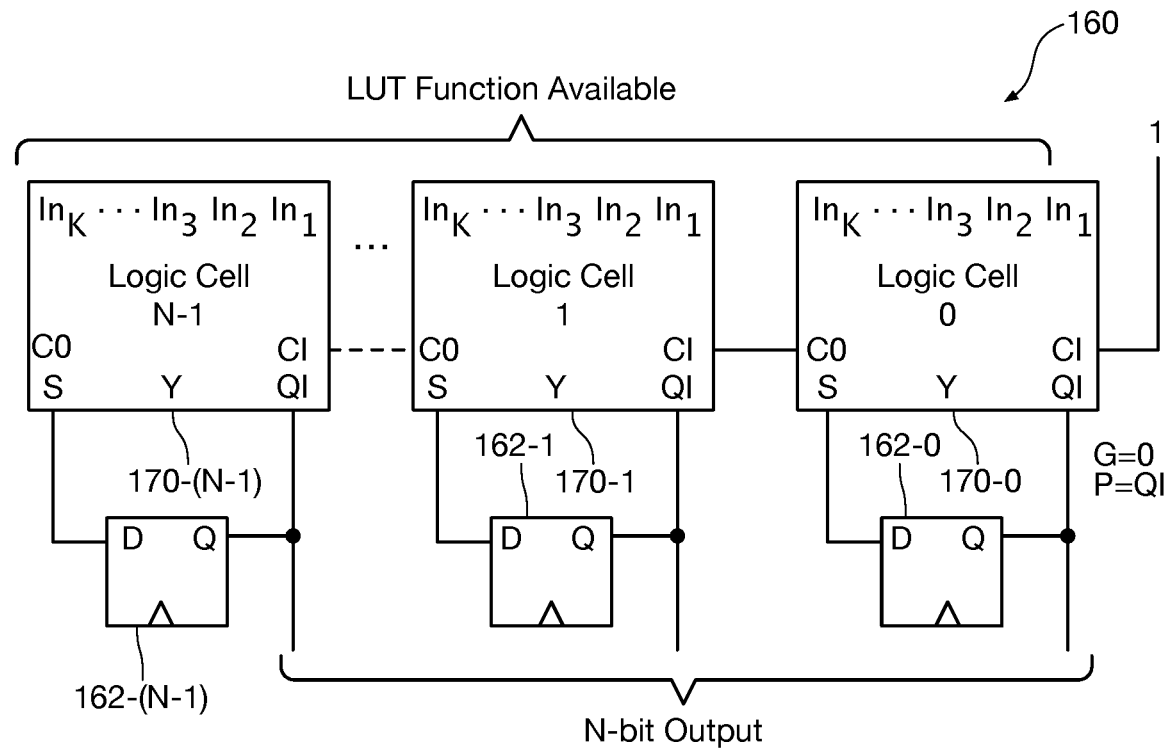
FIG. 5 is a block diagram of an up counter in accordance with an aspect of the present invention using one logic cell of FIG. 4 per bit.

FIG. 5 is a block diagram that shows how the logic cell 120 of FIG. 4 can be used to implement an up counter. FIG. 5 shows an N-bit up counter 160 formed from (N-1) logic cells 120-0, 120-1, and 120-(N-1). As shown in FIG. 5, the second multiplexer 32 in FIG. 4 is set so its output G is the value logic 0, and multiplexer 36 is set so its output P is the value at input QI 140 of the logic cell 120 of FIG. 4. The carry-in CI input 42 of the logic cell 120 representing the lowest significant bit is set to logic 1, and the carry-in input CI 42 of each of the successive more significant bits is connected to the carry-out output CO 44 of the adjacent less significant bit logic cell 120. Data flip-flops 162-0 through 162-(N-1) each have their data inputs connected to the S output (138 in FIG. 4) of the logic cell 110 included in their respective counter stage. The Q outputs of the flip-flops 162-0 through 162-(N-1) are each connected to the QI input (140 in FIG. 4) of the logic cell included in their respective counter stage.

As shown in FIG. 5, none of the LUT inputs (shown for convenience as $In_1$, $In_2$, $In_3$, . . . $In_K$ in an instance of the invention employing K-input LUTs 122), nor the Y output, of all of the logic cells (120-0, 120-1, and 120-(N-1) are utilized in performing the counter function and so each cell can be used to generate any function of the K inputs ($In_1$, $In_2$, $In_3$, . . . $In_K$ in FIG. 5) simultaneously with the operation of the up-counter function. This is not possible using any of the prior-art logic cells.

Figure 6:
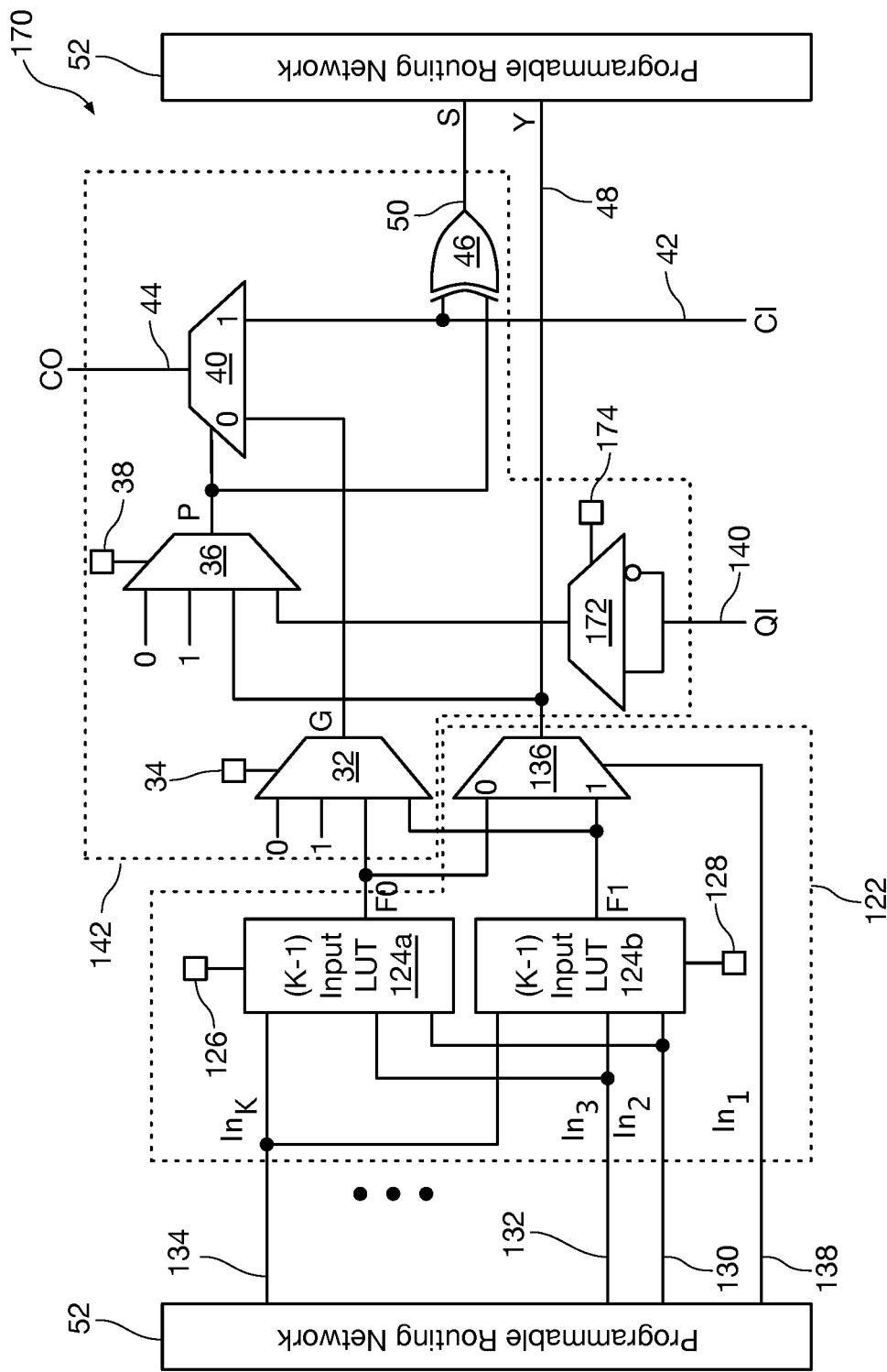
FIG. 6 is a block diagram of a logic cell in accordance with an aspect of the present invention that supports both an up counter function and a down counter function.

Referring now to FIG. 6, a block diagram shows a variation of the logic cell of FIG. 4. The logic cell 170 of FIG. 6 includes many of the same elements present in the logic cell 120 of FIG. 4. These elements common to both drawing figures will be referenced using the same reference numerals employed in FIG. 4. The elements common in the logic cell 170 that are common to the logic cell 120 are connected as described with reference to FIG. 4.

The difference between the logic cell 170 of FIG. 6 and the logic cell 120 of FIG. 4 is that the logic cell 170 of FIG. 6 further includes a fourth multiplexer 172 having a first data input and a second data input. The second data input is an inverting data input. The first and second data inputs are coupled together to the counter input QI 140 of the logic cell 170, and a select input is coupled to configuration circuitry for the logic cell represented by small square 174. The output of the fourth multiplexer 172 is coupled to the first data input of the third multiplexer 36.

The fourth multiplexer 172 selectively inverts the value present at the QI input 134 as configured by configuration bit 174. The logic cell 170 of FIG. 6 thus employs the fourth multiplexer 172 as a programmable inverter to support both an up counter and a down counter function by setting the configuration bit at reference numeral 174 to pass either the non-inverted or the inverted QI input at reference numeral 140. As was the case with the logic cell of FIG. 4, in some implementations of the invention, either of the F0 or F1 inputs from the LUTS 124a and 124b, or the logic-high constant voltage input can be omitted from the second multiplexer 32, and/or the logic-high constant voltage input can be omitted from the third multiplexer 36.

Figure 7:
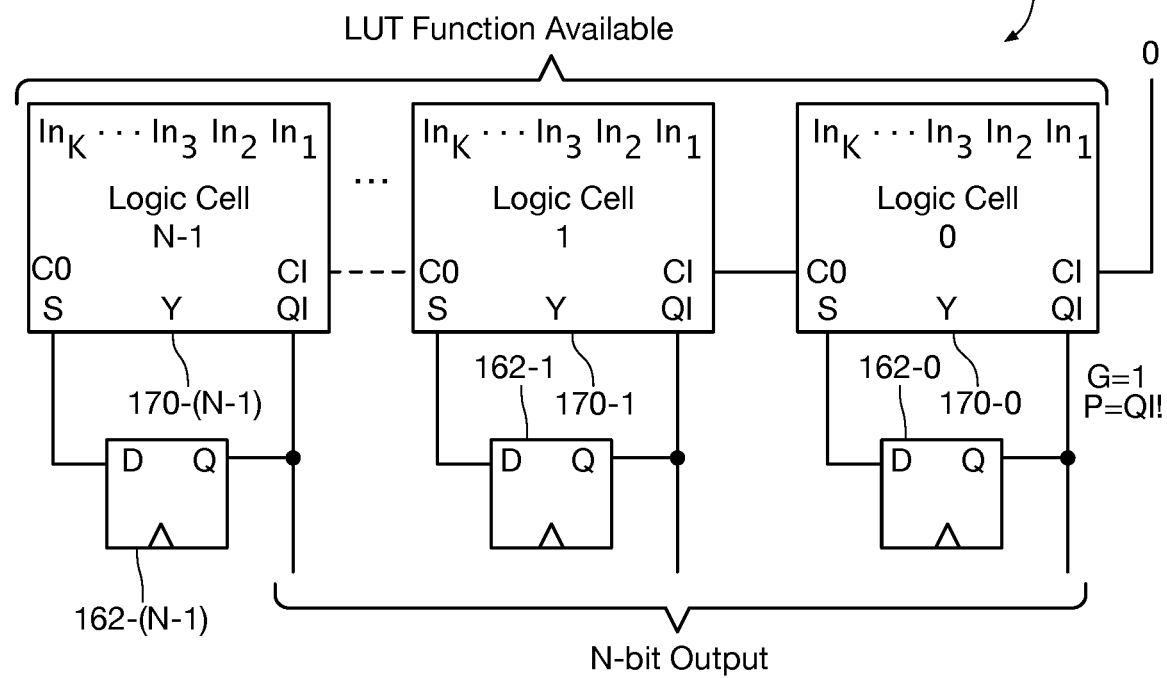
FIG. 7 is a block diagram of a down counter in accordance with an aspect of the present invention using one logic cell of FIG. 6 per bit.

FIG. 7 is a block diagram showing the logic cell of FIG. 6 used to implement a down counter. FIG. 7 shows an N-bit counter 180 that uses (N-1) logic cells. The carry-in CI input of the lowest significant bit is set to logic 0 (instead of to logic 1 in the counter depicted in FIG. 5). As shown in FIG. 7, the output of the second multiplexer 32 in FIG. 6 is set to pass the value logic 1, and the output P of the third multiplexer 36 is set to pass the value at input QI 140 of the logic cell 170 of FIG. 6 inverted by the fourth multiplexer 172. As also shown in FIG. 7, all of the LUT inputs of all of the logic cells (0, 1, and N-1) can be used to generate any function of the K inputs simultaneously with the operation of the up or down counter function.

One of the attractive features of the present invention is that, when implementing both up and down counters, as shown respectively in FIG. 5 and FIG. 7, the entire K-input LUT portion 112 of each logic cell 120 and 170 that is used remains available to generate any function of all of the LUT inputs. This is not possible using prior-art logic cells and is a significant advantage of the logic cell of the present invention in that user designs can be implemented using fewer logic cells than in the prior art.

Figure 8:
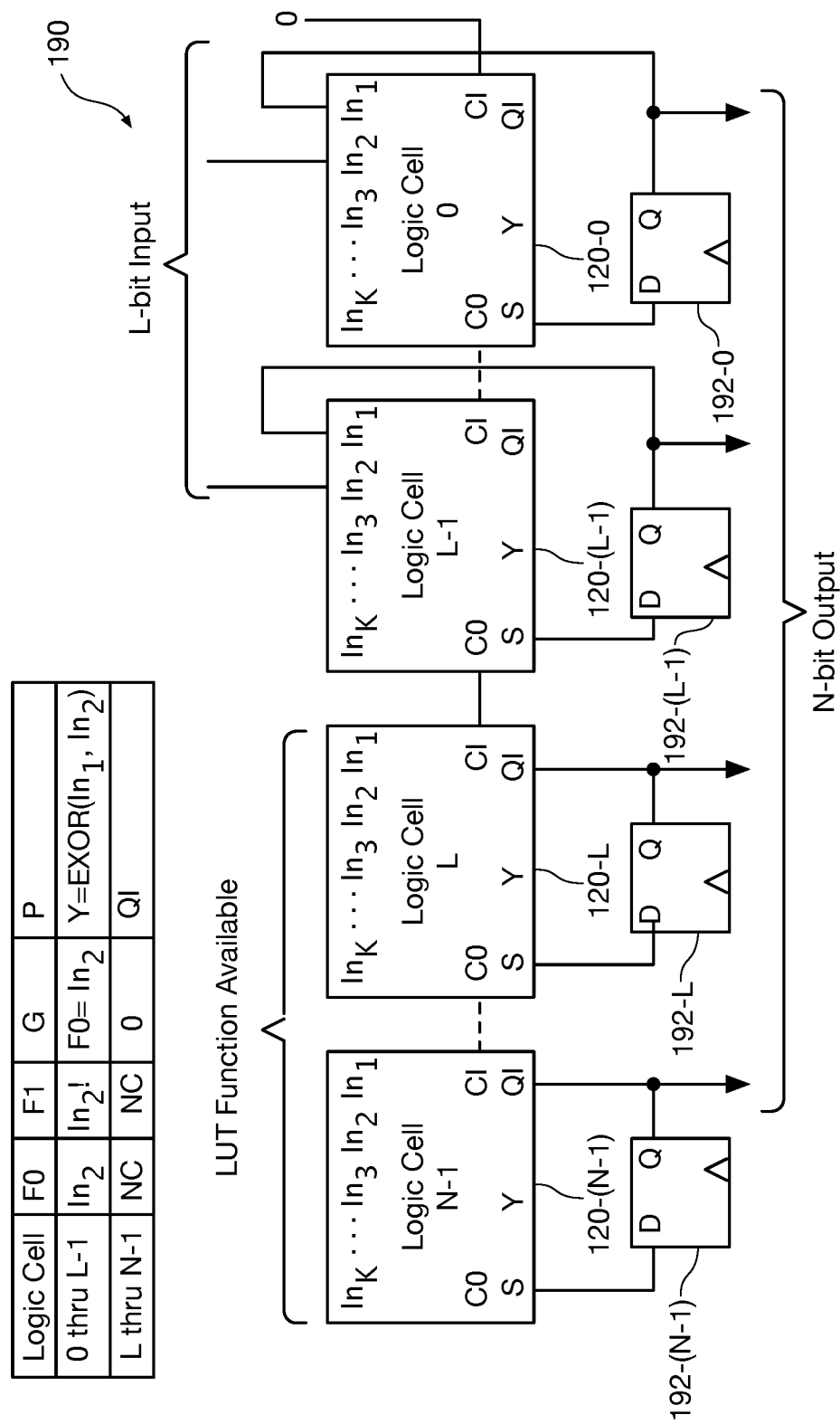
FIG. 8 is a block diagram of an accumulator having an L-bit input and an N-bit output in accordance with an aspect of the present invention using one logic cell of FIG. 4 per output bit.

Further demonstration of the versatility of the logic cells 120 and 170 of FIG. 4 and FIG. 6 is shown in FIG. 8, a block diagram that shows how logic cells like those of FIG. 4 can be used to implement an accumulator. FIG. 8 depicts an accumulator having an L-bit input and an N-bit output. The N-bit accumulator 190 employs N logic cells shown as 120-0 through 120-N connected as shown. The CI input of the logic cell 120-0 is connected to a constant logic low "0" level. The CO output of each logic cell is connected to the CI input of the next logic cell in the accumulator.

Each logic cell 120-0 through 120-(N-1) is associated with a data flip-flop 192-0 through 192-(N-1) respectively. The S output of each logic cell is coupled to the D input of its associated data flip-flip. The Q output of each data flip-flop 192-L through 192-(N-1) is coupled to the QI input of its associated logic cell.

The $In_1$ inputs of logic cells 120-0 through 120-(L-1) are coupled to the Q outputs of their associated data flip-flops. The $In_2$ inputs of logic cells 120-0 through 120-(L-1) are coupled to the individual bits of the L-bit input to the accumulator 190. The table in FIG. 8 shows the configuration of each of the logic cells in the accumulator.

When implementing accumulators, the entire LUT portion of a logic cell implementing one of the more significant bits of the accumulator 190 remain fully available for other purposes as shown in FIG. 8. As may be seen from an examination of FIG. 8, the LUT functions of logic cells 120-L through 120-(N-1) remain available for use simultaneously with the operation of the accumulator 190. While the above has been described in relation to logic cells 120, one skilled in the art will recognize that this is equally applicable to logic cells 170.

Figure 3A:
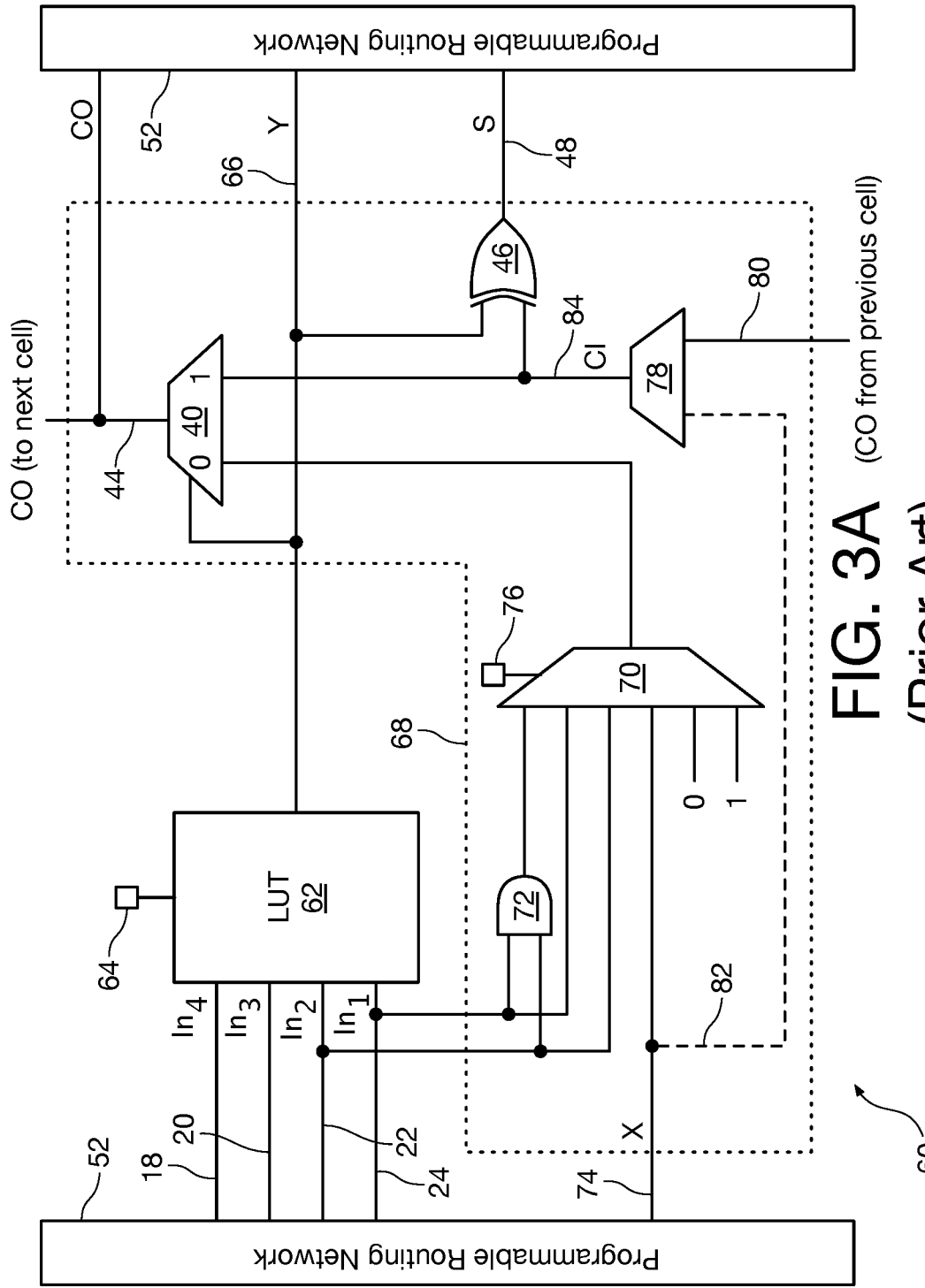
FIG. 3A is a diagram of a prior-art logic cell including a 4-input LUT and additional connections to the programmable routing network for carry-in and carry-out.
Figure 3B:
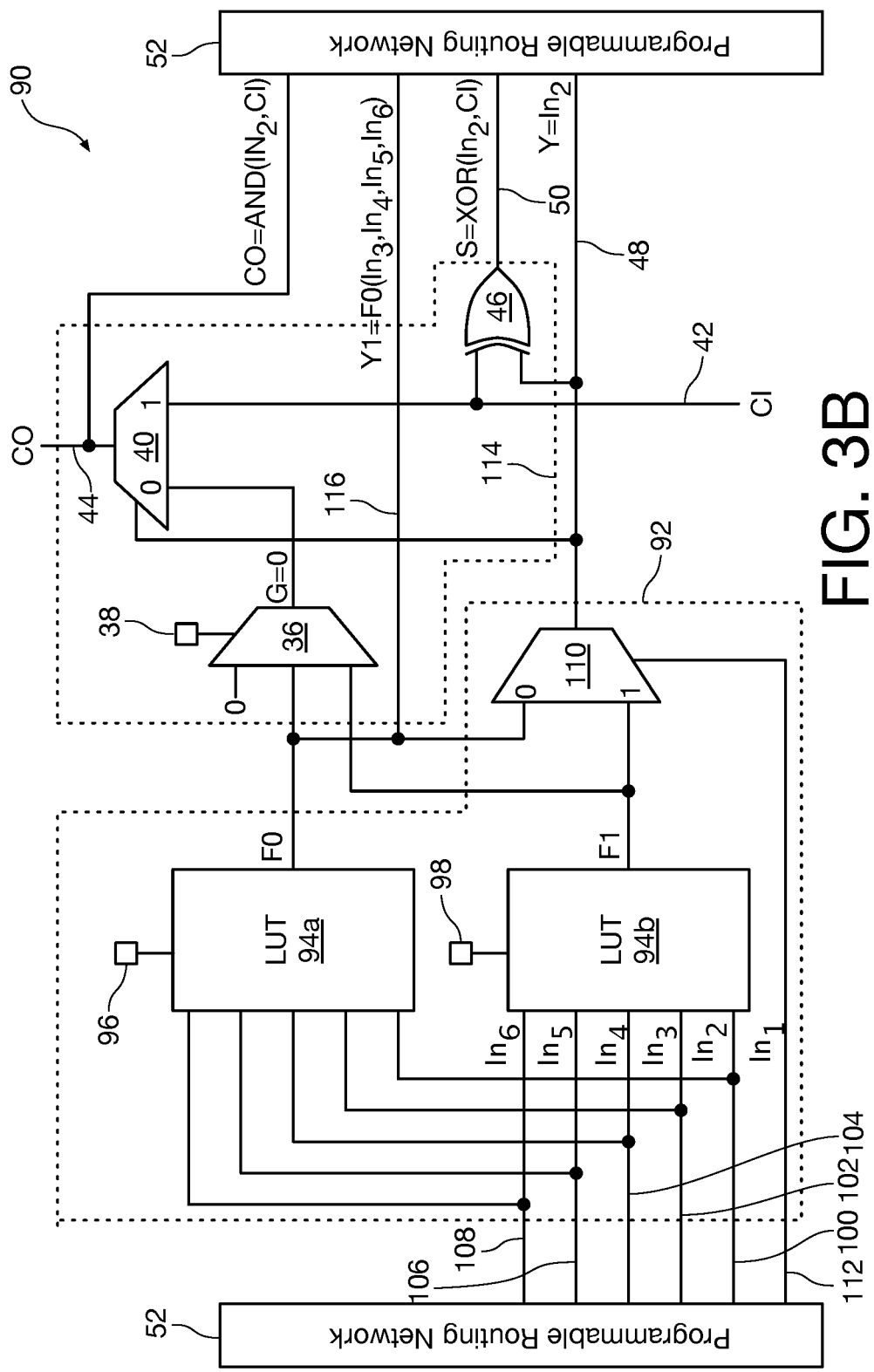
FIG. 3B is a block diagram of a prior-art logic cell including a fracturable K-input LUT and capable of simultaneously implementing an up-counter and any (K-2)-input function (where K=6)
Figure 9A:
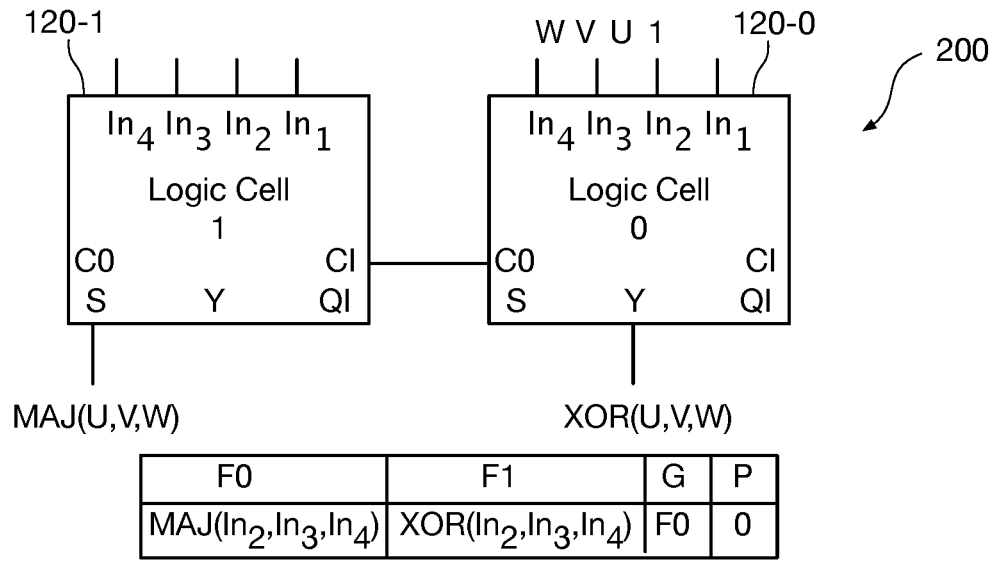
FIG. 9A is a block diagram of a 3:2 compressor implemented in accordance with an aspect of the present invention using logic cells of FIG. 4.
Figure 9B:
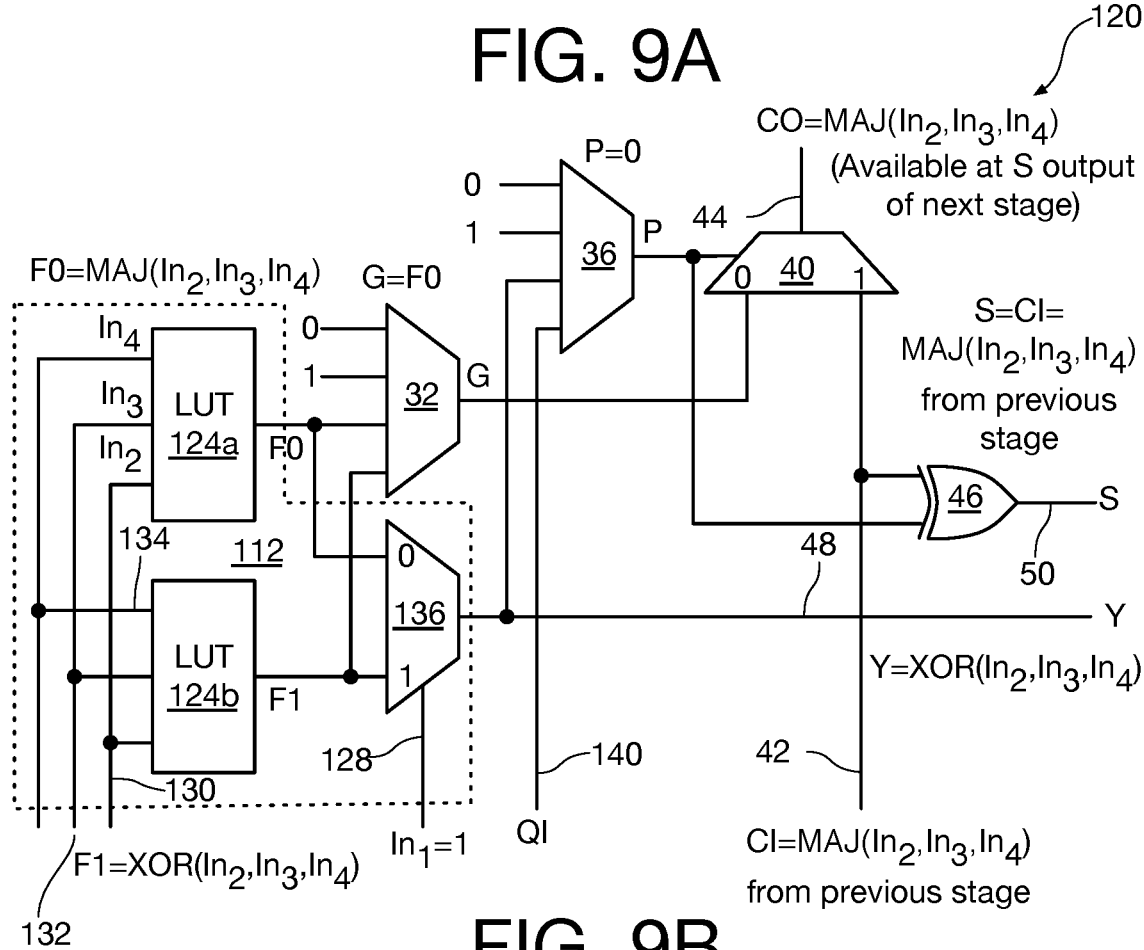
FIG. 9B is a detailed view of a 3:2 compressor implemented in accordance with an aspect of the present invention using logic cells of FIG. 4.

Another example of the versatility of the logic cells 120 and 170 of FIG. 4 or FIG. 6 is shown in FIG. 9A. The logic cells of the present invention have the ability, by setting P=0, to transmit the value of the CI input to the S output and on to the programmable routing network while leaving the LUT available to implement in parallel any independent function of K inputs. In contrast with the prior-art cell of FIG. 3A, no additional, expensive connection between CI or CO and the programmable routing network is required. This ability can, for example, allow a more efficient implementation of compressors. Implementing a 3:2 compressor with the prior-art logic cell of FIG. 1 would fully consume two cells. FIG. 9A shows how a 3:2 compressor can be implemented with the logic cells 120 or 170 using only portions of two logic cells. Persons of ordinary skill in the art will appreciate that logic cell 120-1 of FIG. 9A still has its $In_1$, $In_2$, $In_3$, and $In_4$ inputs and Y and CO outputs available, and enough of its internal logic available, that it can also serve as the first logic cell of an additional 3:2 compressor, or as an independent K-input function. In this way, M compressors can be implemented in M+1 logic cells, versus 2M using the prior art cell of FIG. 1. The incremental cost of a 3:2 compressor is thus only one logic cell. Further details of this implementation are shown in FIG. 9B particularly illustrating an implementation with logic cell 120, it being understood that a similar implementation may be performed utilizing logic cell 170.

Figure 10A:
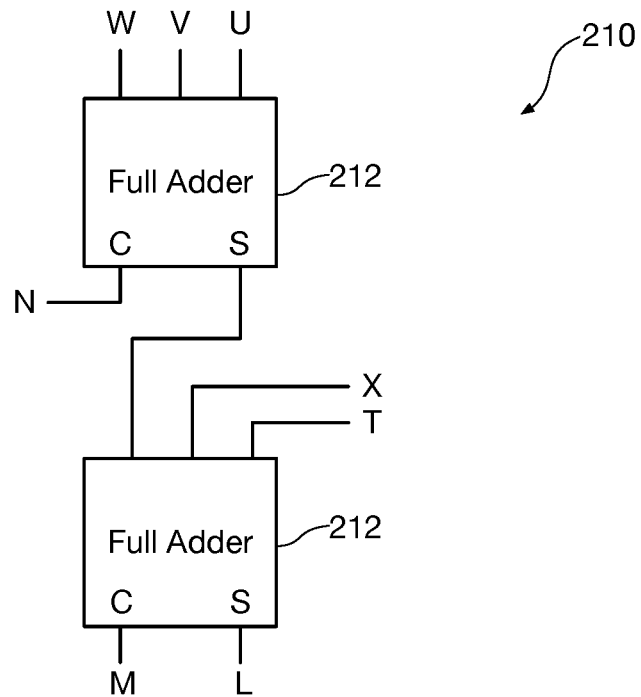
FIG. 10A is a functional block diagram of a 4:2 compressor.
Figure 10B:
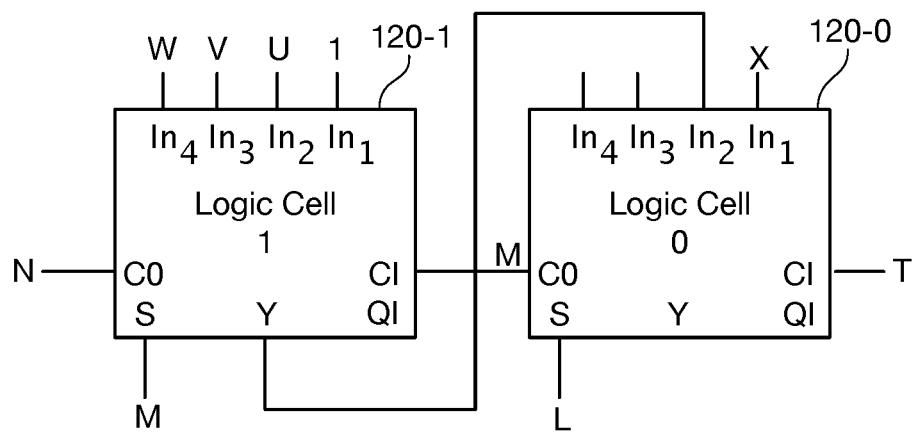
FIG. 10B is a block diagram of a 4:2 compressor implemented in accordance with an aspect of the present invention using logic cells like those of FIG. 4.

Yet another example of the versatility of the logic cells 120 and 170 of FIG. 4 or FIG. 6 is shown in FIGS. 10A and 10B. FIG. 10A is a block diagram of a 4:2 compressor 210 formed from two full adders 212 as shown. FIG. 10A defines the function of a 4:2 compressor in terms of the well-known full-adder cell 212. The compressor 210 is fed from inputs arbitrarily designated as inputs T, U, V, W, and X. The input T would be driven by the output N of a previous compressor in a chain. FIG. 10B is a block diagram illustrating how only two logic cells 120-0 and 120-1 are required to implement the 4:2 compressor 210 of FIG. 10A and includes a table showing the configuration of logic cells 120-0 and 120-1 to implement this function. The top full adder 212 of FIG. 10A is implemented in Logic Cell 1 of FIG. 10B. The lower full adder 212 is implemented in Logic Cell 0, including generation of the signal M which then passes through Logic Cell 1 from the CI input to the S output. As shown in FIG. 10B, a 4:2 compressor can be implemented using two of the logic cells 120 of the present invention while it would take at least three of the prior-art logic cells shown in FIG. 1 to implement this function. While the above has been described in relation to logic cells 120, one skilled in the art will recognize that this is equally applicable to logic cells 170.

Figure 11:
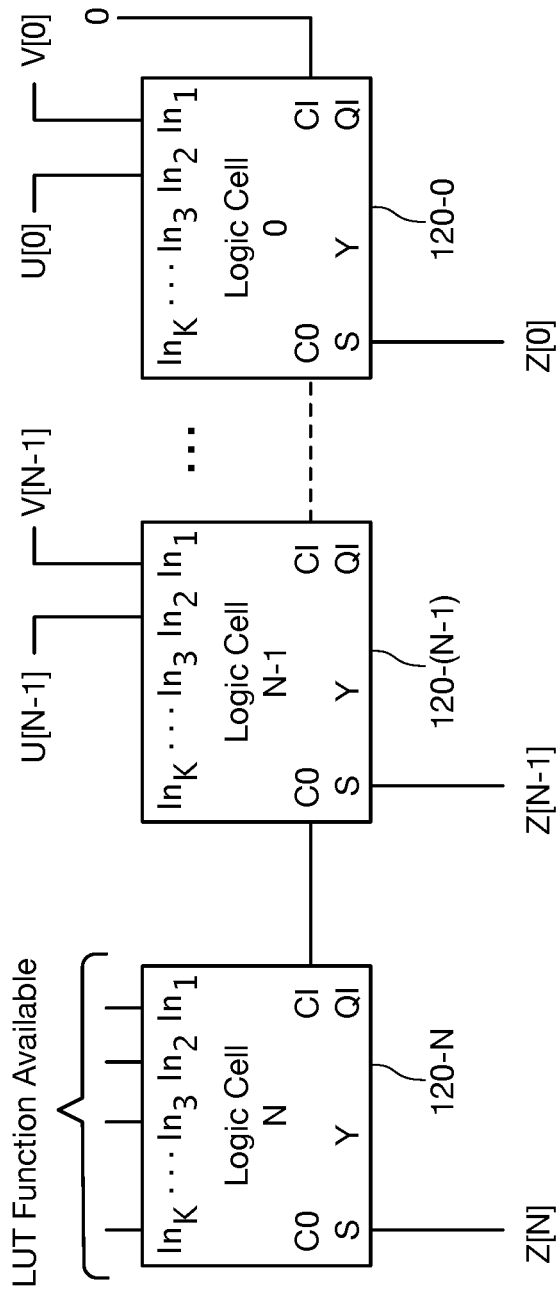
FIG. 11 is a block diagram of a 2-input adder implemented in accordance with an aspect of the present invention using logic cells like those of FIG. 4.

Referring now to FIG. 11, a block diagram shows a two-input, N-bit adder 220 implemented in accordance with an aspect of the present invention using logic cells 120 of FIG. 4. The N-bit adder 220 employs N+1 logic cells shown as 120-0 through 110-N connected as shown. The CI input of the logic cell 120-0 is connected to a constant logic low "0" level. The CO output of each logic cell 120 is connected to the CI input of the next logic cell 120 in the adder 220.

The In$_1$ and In$_2$ inputs of logic cells 120-0 through 120-(N-1) are coupled to the N operand inputs U[0] through U[N-1] and V[0] through V[N-1], respectively, for the adder 220. The S outputs of each logic cell 120-0 through 120-N form the sum outputs for each of the N+1 output bits of the adder. The table in FIG. 11 shows the configuration of each of the logic cells 120 in the adder 220. The logic cell 120-N need only pass its carry-in (CI) input to its sum (S) output and on to the programmable routing network. Advantageously, this leaves its LUT available to implement in parallel any unrelated function of K inputs. While the above has been described in relation to logic cells 120, one skilled in the art will recognize that this is equally applicable to logic cells 170.

While aspects and applications of this invention have been shown and described, it would be apparent to those skilled in the art that many more modifications than mentioned above are possible without departing from the inventive concepts herein. For instance, the abilities shown in FIGS. 9A, 9B and 10B depend only on the aspect of the invention that P rather than Y is used to drive the exclusive-OR gate, and so could be realized in an alternate embodiment that does not include the addition of the QI input shown in FIG. 4. The invention, therefore, is not to be restricted except in the spirit of the appended claims.

What is claimed is:

1. A logic cell for a programmable logic integrated circuit comprising:
    K data inputs;
    a primary output;
    a carry-in input;
    a carry-out output;
    a counter input;
    a sum output;
    a K-input lookup table (LUT) having K LUT inputs each connected to a different one of the K data inputs, and a LUT output directly connected to the primary output, the K-input LUT including:
        a first (K-1)-input lookup table LUT and a second (K-1)-input LUT both sharing in common second through Kth inputs to the K-input LUT, each of the first and second (K-1)-input LUTs having an output;
        a first multiplexer having a first input coupled to the output of the first (K-1)-input LUT, a second data input coupled to the output of the second (K-1)-input LUT, and a select input coupled to a first input of the K-input LUT, the first multiplexer having an output forming the LUT output that is directly connected to the primary output; and
    a carry circuit comprising:
        a second multiplexer having a first data input coupled to the output of one of the first and second (K-1)-input LUTs, a second data input coupled to a logic-low constant voltage, select inputs coupled to configuration circuitry for the logic cell, and a data output;
        a third multiplexer having a first data input coupled to the counter input of the logic cell, a second data input coupled to the LUT output, a third data input coupled to a logic-low constant voltage, select inputs coupled to configuration circuitry for the logic cell, and a data output;
        a carry-out multiplexer having a first data input coupled to the data output of the second multiplexer, a second data input coupled to the carry-in input of the logic cell, a select input coupled to the data output of the third multiplexer, and a data output coupled to the carry-out output of the logic cell; and
        an exclusive-OR gate having a first input coupled to the carry-in input of the logic cell, a second input coupled to the data output of the third multiplexer, and an output coupled to the sum output of the logic cell.

2. The logic cell of claim 1 wherein the carry circuit further comprises:
    a fourth multiplexer coupled between the counter input of the logic cell and the first data input of the third multiplexer, the fourth multiplexer having a first data input and a second data input, the second data input being an inverting data input, the first and second data inputs coupled together to the counter-input of the logic cell, a select input coupled to configuration circuitry for the logic cell, and an output coupled to the first data input of the third multiplexer.

3. The logic cell of claim 1 wherein at least one of the second and third multiplexers has a data input coupled to a logic-high constant voltage.

4. The logic cell of claim 1 wherein the second multiplexer has a data input coupled to the output of the first (K-1)-input LUT and a data input coupled to the output of the second (K-1)-input LUT.

5. A logic cell for a programmable logic integrated circuit comprising:
    a first data input and a plurality of additional data inputs;
    a first lookup table (LUT) having an output and a plurality of inputs, each of the plurality of inputs of the first LUT connected to a respective one of the plurality of additional data inputs;
    a second LUT having an output and a plurality of inputs, each of the plurality of inputs of the second LUT connected to a respective one of the plurality of additional data inputs;
    a first multiplexer having a first input coupled to the output of the first LUT, a second input coupled to the output of the second LUT, and a select input coupled to the first data input, the first multiplexer having an output that is directly connected to a primary output of the logic cell;
    a second multiplexer having a first data input coupled to the output of the second LUT, a second data input coupled to a logic-low constant voltage, select inputs coupled to configuration circuitry for the logic cell and a data output;

a third multiplexer having a first data input coupled to a counter input of the logic cell, a second data input coupled to the primary output of the logic cell, a third data input coupled to a logic-low constant voltage, select inputs coupled to configuration circuitry for the logic cell and a data output;

a carry-out multiplexer having a first data input coupled to the data output of the second multiplexer, a second data input coupled to a carry-in input of the logic cell, a select input coupled to the data output of the third multiplexer and a data output coupled to a carry-out output of the logic cell; and an exclusive-OR gate having a first input coupled to the carry-in input of the logic cell, a second input coupled to the data output of the third multiplexer, and an output coupled to a sum output of the logic cell.

* * * * *